(12) United States Patent
Korkala

(10) Patent No.: US 6,462,685 B1
(45) Date of Patent: Oct. 8, 2002

(54) DITHER SIGNAL INSERTION INVERSELY PROPORTIONAL TO SIGNAL LEVEL IN DELTA-SIGMA MODULATORS

(75) Inventor: Vesa Korkala, Oulu (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 09/826,980

(22) Filed: Apr. 5, 2001

(51) Int. Cl.$^7$ ............................. H03M 3/00; H03M 1/20
(52) U.S. Cl. ..................... 341/131; 341/143; 341/150
(58) Field of Search ............................. 341/131, 144, 341/150

(56) References Cited

U.S. PATENT DOCUMENTS

| | | | | |
|---|---|---|---|---|
| 4,611,195 A | * | 9/1986 | Shosaku | 341/150 |
| 4,751,496 A | * | 6/1988 | Araki et al. | 341/131 |
| 4,857,927 A | * | 8/1989 | Takabayashi | 341/131 |
| 4,937,576 A | * | 6/1990 | Yoshio et al. | 341/131 |
| 5,144,308 A | | 9/1992 | Norsworthy | 341/131 |
| 5,745,061 A | * | 4/1998 | Norsworthy et al. | 341/131 |
| 5,889,482 A | | 3/1999 | Zarubinsky et al. | |
| 5,990,815 A | | 11/1999 | Linder et al. | 341/131 |
| 5,990,819 A | | 11/1999 | Fujimori | |
| 6,011,501 A | | 1/2000 | Gong et al. | |
| 6,087,969 A | | 7/2000 | Stockstad et al. | 341/143 |
| 6,326,911 B1 | | 12/2001 | Gomez et al. | 341/143 |

FOREIGN PATENT DOCUMENTS

WO   WO 98/44626   8/1998   ........... H03F/3/217

OTHER PUBLICATIONS

Multibit Σ–Δ A/D Converter Incorporating A Novel Class of Dynamic Element Matching Techniques; Leung, Bosco H et al; IEEE Transactions on Circuits and Systems II Analog and Digital Signal Processing, vol. 39 No. 1; Jan. 1992.

Linearity Enhancement of Multibit ΔΣ A/D and D/A Converters Using Data Weighted Averaging; Baird, Rex T. et al; IEEE Transactions on Circuits and Systems II Analog and Digital Signal Processing, vol. 42 No. 12; Dec. 1995.

A Noise–Shaping Coder Topology for 15+ Bit Converters; Carley, L. Richard; IEEE Journal of Solid–State Circuits, vol. 24, No. 2; Apr. 1989.

* cited by examiner

*Primary Examiner*—Howard L. Williams
(74) *Attorney, Agent, or Firm*—Harrington & Smith, LLP

(57) ABSTRACT

A method is disclosed to operate a sigma-delta modulator of a type that includes a quantizer. The method has steps of (a) sampling an amplitude of an input signal to the sigma-delta modulator; and (b) controlling the switching of a capacitance bank in accordance with the sampled amplitude of the input signal for generating a dither signal at an input of the quantizer. The dither signal is generated to have a pseudo-random amplitude that is inversely proportional to the sampled amplitude of the input signal. The step of controlling and generating operates a linear feedback shift register to switch individual ones of a plurality of capacitances of the bank of capacitances in and out of a capacitance network. In one embodiment the step of operating the at least one linear feedback shift register turns a linear feedback shift register clock signal on and off as a function of the amplitude of the input signal. In one embodiment the step of sampling operates at least one window detector, and the dither signal is turned off and on depending on a relationship between the amplitude of the input signal and voltage thresholds of the window detector. In another embodiment the step of sampling operates a rectifier that rectifies the input signal to provide a rectified output signal, and the step of controlling and generating pseudorandomly applies the rectified output signal to the bank of capacitances for controlling an amount of current that is transferred between the input of the quantizer and the bank of capacitances.

18 Claims, 10 Drawing Sheets

DITHER SIGNAL INSERTION INVERSELY PROPORTIONAL TO SIGNAL LEVEL IN DELTA-SIGMA MODULATORS

FIELD OF THE INVENTION

This invention relates generally to sigma-delta (SD) modulators and, more specifically, to SD modulators used in analog-to-digital converter circuitry and that employ a dither signal to improve their performance.

BACKGROUND OF THE INVENTION

SD modulators used in analog-to-digital converters (ADCs) are well known in the art. Reference may be had, by example, to S. R. Norsworthy et al., "Delta-Sigma Data Converters", IEEE Press, NY, 1997, and to J. G. Proakis et al., Digital Signal Processing" Third Edition, Prentice-Hall, 1996.

Conventional SD modulators are known to suffer from the generation of tones, i.e., undesirable signals that manifest themselves as periodic fluctuations, the amplitude and frequency of which are a function of the amplitude and frequency of the input signal. The tones are generated mainly because the quantization noise is not always random, especially when the input signal amplitude and frequency are low. A conventional technique to overcome this problem is to use a dither signal that is added to the input signal. Reference in this regard can be had to U.S. Pat. No. 5,889,482, "Analog-to-Digital Converter Using Dither and Method for Converting Analog Signals to Digital Signals", by M. Zarubinsky et al. The approach of Zarubinsky et al. is to add in the dither signal in the SD modulator, and to then cancel or suppress the dither signal before it reaches the output terminal of the ADC. This technique is said to preserve a high signal-to-noise ratio (SNR) and to provide low spectral tones in the output signal. If the input signal to the converter has a small amplitude, then the signal at the output of sigma-delta modulator is highly correlated with the dither signal D. If the input signal is close to the maximum admissible amplitude, the modulator partially suppresses the dither signal, and the output signal remains substantially without non-linear distortions.

FIG. 4B of Zarubinsky et al. shows the dither signal D, which can be a multilevel signal with different magnitudes between maximum and minimum values. The magnitude of the dither signal is expressed as BD, which remains constant over one time interval, and where a step index n various randomly.

A disadvantage of the use of the dither signal, in particular one with a constant amplitude, is that the maximum allowable input signal at the input to the SD modulator is reduced as the probability is increased of overloading the quantizer. The end result is a reduction in the dynamic range of the ADC.

A need exists to provide an improved sigma-delta modulator and a dither signal, in particular a switched capacitor (SC) SD modulator, as well as a continuous time SD modulator, where the use of the dither signal does not have an adverse effect on the dynamic range of the ADC, and where the dither signal is generated in a simple manner that makes efficient use of integrated circuit area and that operates with a small power consumption.

OBJECTS AND ADVANTAGES OF THE INVENTION

It is a first object and advantage of this invention to provide an improved sigma-delta modulator.

It is a further object and advantage of this invention to provide an improved sigma-delta modulator that does not suffer from a significant reduction in dynamic range due to the use of a dither signal.

SUMMARY OF THE INVENTION

The foregoing and other problems are overcome and the foregoing objects and advantages are realized by methods and apparatus in accordance with embodiments of this invention.

The teachings of this invention provide embodiments of low complexity, single-bit SD modulators that employ a dither signal having an amplitude that is a function of the amplitude of the input signal to the SD modulator. The teachings of this invention apply as well to multi-bit SD modulators. In these embodiments pseudorandom noise is added to an input of a SD modulator quantizer as a dither signal, and the amplitude of the pseudorandom noise is controlled in such a manner as to be inversely proportional to the amplitude of the input signal, i.e., the amplitude of the dither signal is smallest when the amplitude of the input signal is largest and vice versa.

In the presently preferred embodiments at least one linear feedback shift register (LFSR) is used to generate a pseudorandom code sequence that in turn is used to control the switching of voltage potentials to inputs of banks of voltage variable capacitances coupled to input nodes of the quantizer. The variation in capacitance at the input nodes of the quantizer generates voltage transitions in the quantizer input signal, thereby dithering the input signal to the quantizer.

In a further embodiment of this invention embodiment of this invention the instantaneous amplitude of the input signal is quantized with at least one low complexity window detector which controls the clock signal to the at least one LFSR.

A method is disclosed to operate a sigma-delta modulator of a type that includes a quantizer. The method has steps of (a) sampling an amplitude of an input signal to the sigma-delta modulator; and (b) controlling the switching of a capacitance bank in accordance with the sampled amplitude of the input signal for generating a dither signal at an input of the quantizer. The dither signal is generated to have a pseudorandom amplitude that is inversely proportional to the sampled amplitude of the input signal. The step of controlling and generating operates a linear feedback shift register to switch individual ones of a plurality of capacitances of the bank of capacitances in and out of a capacitance network. In one embodiment the step of operating the at least one linear feedback shift register turns a linear feedback shift register clock signal on and off as a function of the amplitude of the input signal. Preferably the step of sampling samples the input signal to prevent a generation of kickback noise.

In one embodiment the step of sampling operates at least one window detector, and the dither signal is turned off and on depending on a relationship between the amplitude of the input signal and voltage thresholds of the at least one window detector.

In another embodiment the step of sampling operates a rectifier that rectifies an input signal to the quantizer to provide a rectified output signal, and the step of controlling and generating pseudorandomly applies the rectified output signal to the bank of capacitances for controlling an amount of current that is transferred between the input of the quantizer and the bank of capacitances.

In both of these embodiments the presence of the dither signal reduces the undesirable tones in the output signal when the tones are most disturbing (i.e., when the input signal is absent or at a low level), while not degrading the performance of the SD modulator when the input signal amplitude is large.

As the dither signal is random or pseudorandom in nature in both of disclosed embodiments, circuitry that is both simple and inaccurate can be used in the implementation, thereby reducing the required integrated circuit area and power consumption. These are important considerations when the SD converter, and an ADC, are used in mass produced, battery operated consumer goods, such as hand-held cellular telephones and personal communicators.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

Figure 1:
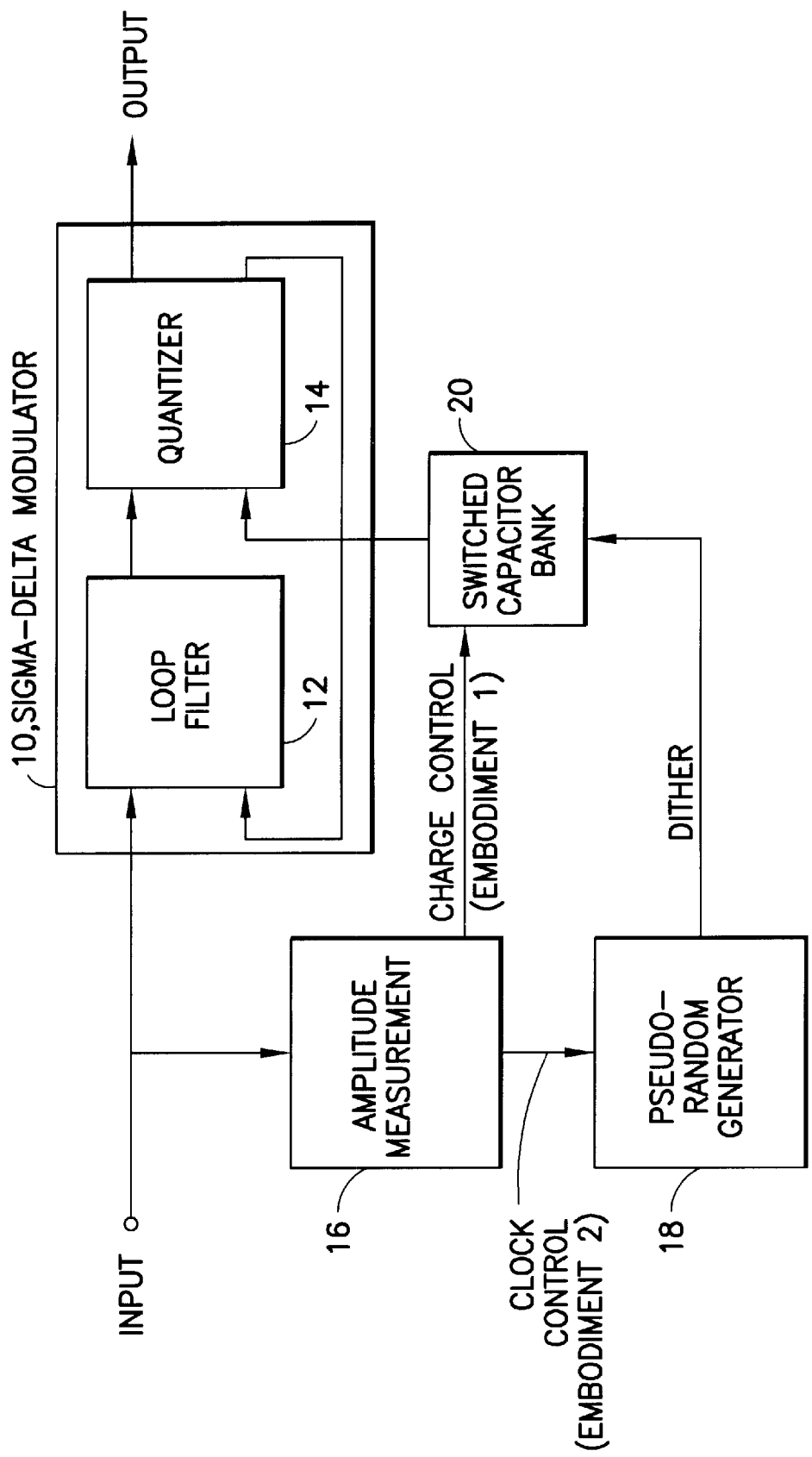
FIG. 1 is a simplified block diagram that depicts an input signal dependent pseudorandom dither signal generation circuit for a SD modulator in accordance with these teachings.

Referring to FIG. 1, there is shown a sigma-delta modulator (SDM) 10 that operates in accordance with the teachings of this invention. The SDM 10 includes an input node for receiving an analog input signal and an output node for outputting a (one bit or a multi-bit) digital output signal. The input signal is applied to a loop filter 12 and from the loop filter to a quantizer 14. The loop filter 12 can include one integrator, or more likely a plurality of integrators connected in series for achieving a desired higher order filtering (e.g., third order or fourth order, or higher). The input signal is also applied to an amplitude measurement block 16 that outputs, in a first embodiment (FIG. 2), an amplitude control signal to a switched capacitor bank 20, and that outputs, in a second embodiment (FIG. 4), a clock control signal to a pseudorandom signal generator block 18. The output of the pseudorandom current generator block 18 is a dither control signal that is applied to the switched capacitor bank 20. The output of the switched capacitor bank 20 is applied to a second input of the quantizer 14. The effect of the operation of either embodiment is to add pseudorandom noise, i.e., a dither signal, at the input of the quantizer 14, where the amplitude of the pseudorandom noise is controlled in such a manner as to be inversely proportional to the amplitude of the input signal. That is, the amplitude of the dither signal is smallest when the amplitude of the input signal is largest and vice versa.

Thus, the teachings of this invention provide simple and cost-effective techniques to implement input signal-dependent dithering in a single bit switched capacitor SD modulator.

Figure 2A:
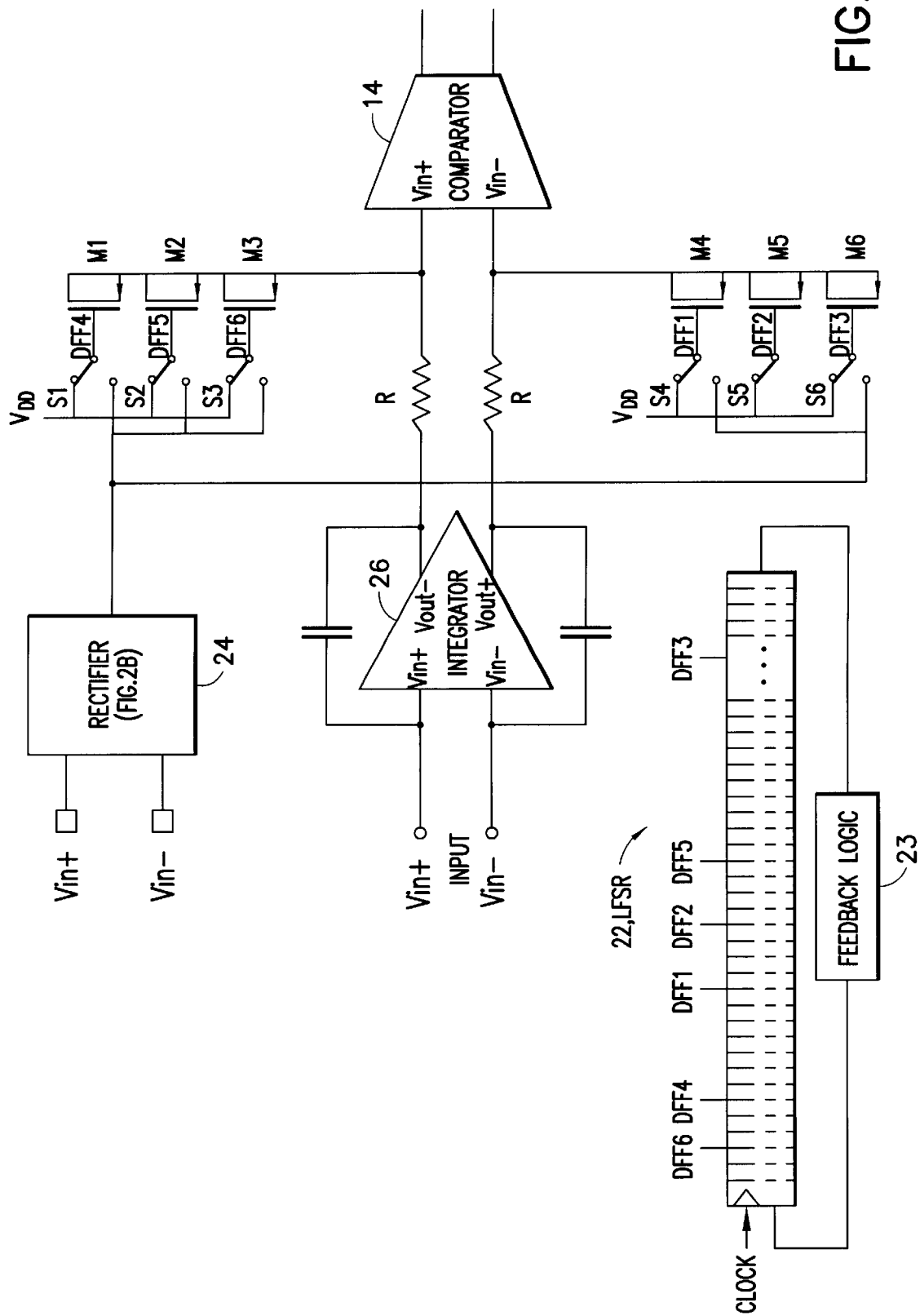
FIG. 2A is a circuit diagram of a first embodiment of the SD modulator that employs an input signal dependent pseudorandom dither signal.

Referring to the first embodiment depicted in FIG. 2A, a plurality of PMOS transistors M1–M6 are connected as capacitors to the input of the quantizer 14, shown as a voltage comparator. Alternatively, a plurality of actual capacitors could be used, either alone or combination with the transistors M1–M6. The gate terminals of M1–M6 are controlled by a Linear Feedback Shift Register (LFSR) 22. The LFSR 22 is coupled with feedback logic 23 to implement the pseudorandom signal generator 18 of FIG. 1, and operates to generate a pseudorandom sequence in a known manner. In the preferred embodiments the code used by the LFSR 22 is a maximal length code with a white spectrum, although colored codes could be employed as well, as they may have the advantage of reducing dither noise in the signal band.

The differential input signal of the SDM 10 is also shown as being input to a rectifier 24. This is a simplification, as will be explained in further detail below in relation to FIG. 8, as the input to the rectifier 24 is preferably obtained from the outputs of an integrator 26, actually a last integrator of a chain of integrators that comprise a multi-order loop filter 12.

Figure 2B:
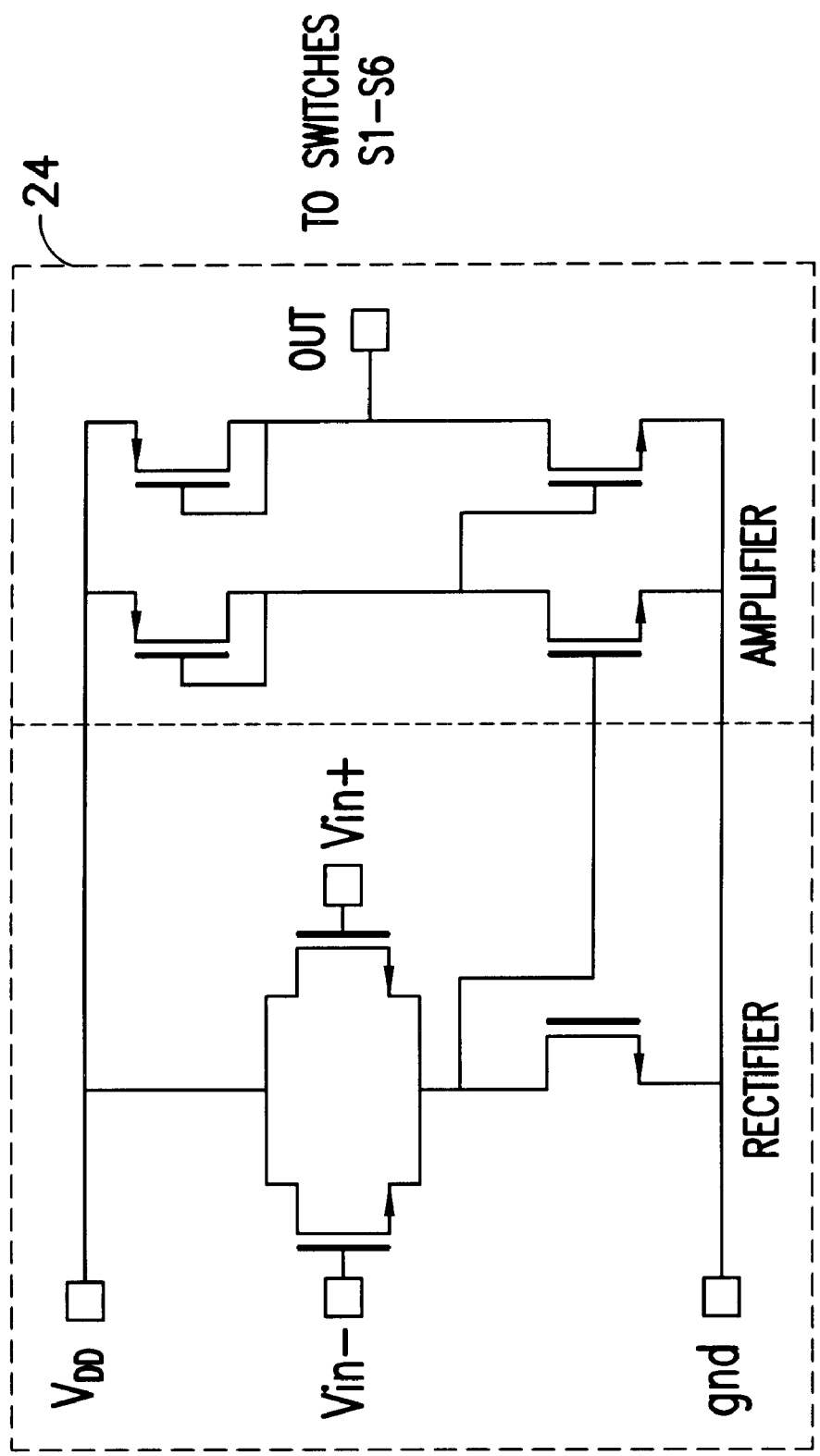
FIG. 2B is a circuit diagram of an embodiment of the rectifier of FIG. 2A.

In this first embodiment the rectifier 24 implements the amplitude measurement block 16 of FIG. 1, and a circuit diagram of one suitable embodiment of the rectifier 24 is shown in FIG. 2B. The dependency of the differential input signal and the output of the rectifier 24 is shown in FIGS. 3A and 3B, where the input signal is shown as a solid line and the output of the rectifier as a dashed line.

Figure 3A:
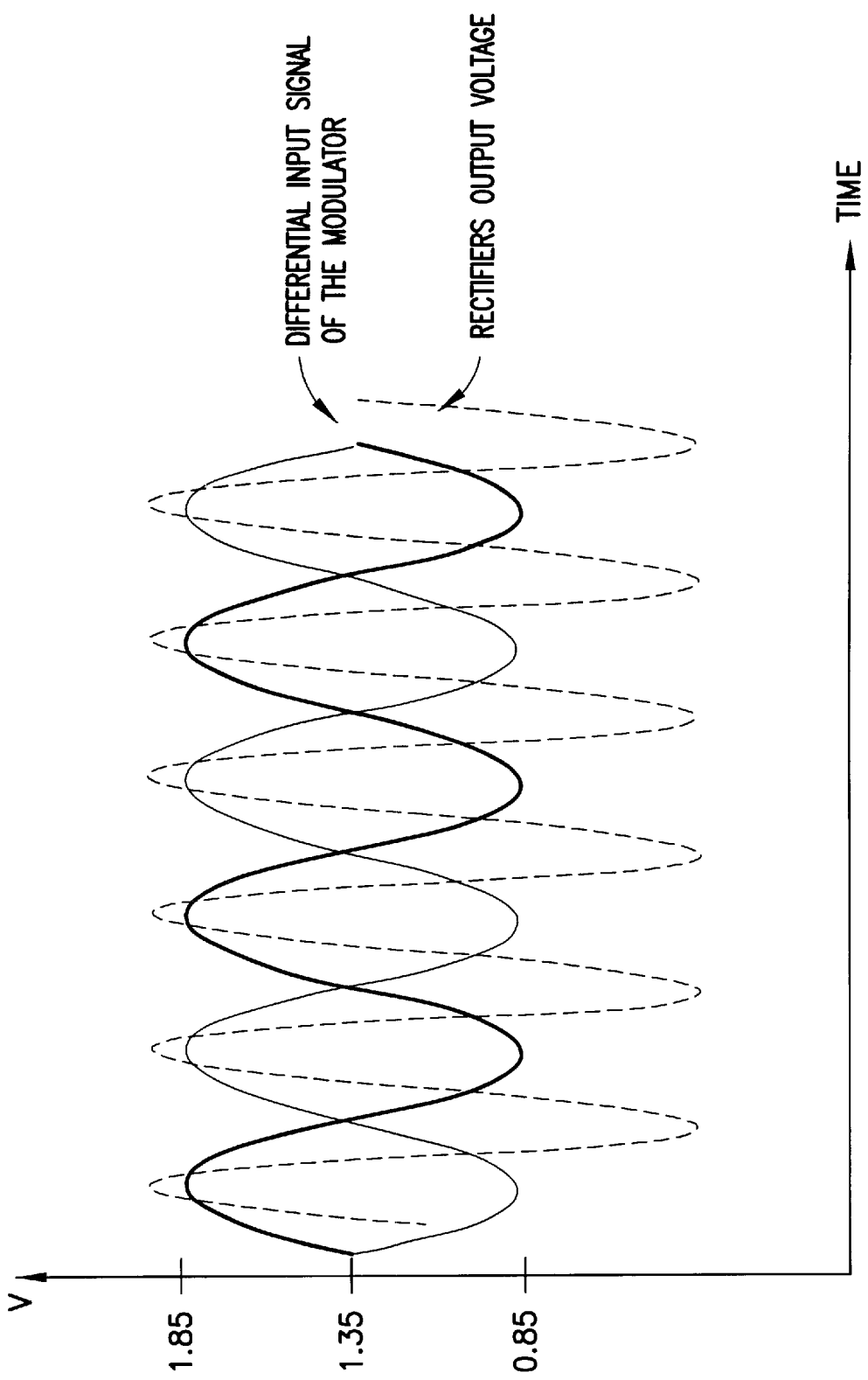
FIGS. 3A and 3B are simulated waveform diagrams that show, for the embodiment of FIG. 2A, the rectified input signal and the dither signal generated for a sine wave input signal.
Figure 3B:
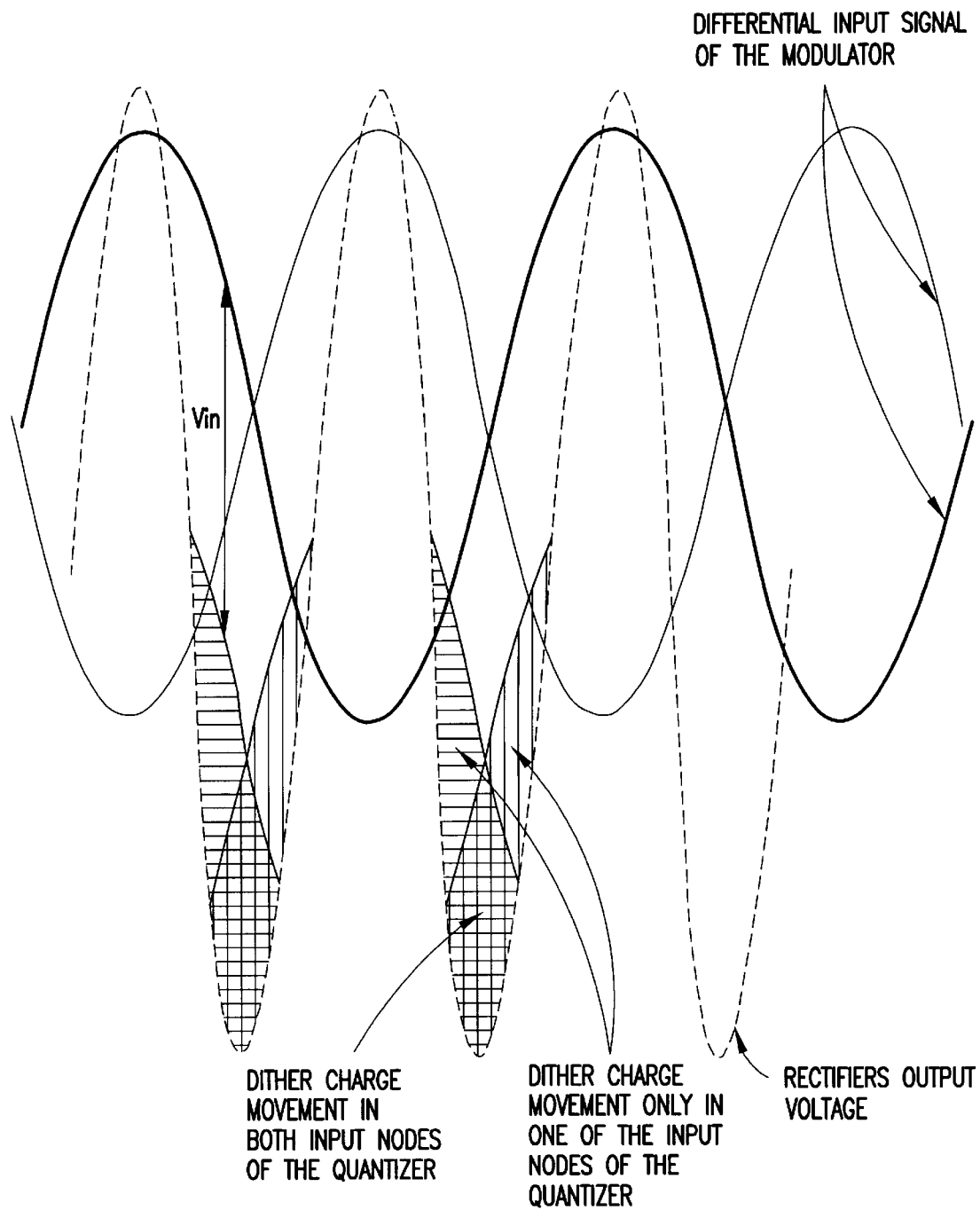

FIGS. 3A and 3B show that as the input signal amplitude becomes smaller, the output voltage of the rectifier 24 becomes larger and vice versa. The output of the rectifier 24 is coupled to the gate terminals of PMOS transistors M1–M6 via single pole, double throw (SPDT) switches S1–S6, individual ones of which are controlled by one of the outputs (DFF1–DFF6) of the LFSR 22. One set of input terminals of the switches S1–S6 is connected to circuit ground, while the other set of input terminals of the switches S1–S6 is connected to the output of the rectifier 24. The shorted source-drain terminals of M1–M6 (remember that M1–M6 function as capacitors) are connected in parallel to the inputs of quantizer 14, with M1–M3 being connected to the Vin+ quantizer input terminal and M4–M6 being connected to the Vin– quantizer input terminal. In other embodiments more or less than six PMOS FETs could be used, and connected through switches controlled by more or less than six of the LFSR 22 DFF outputs. The transistor M1–M6 channel charge is taken from the input nodes of the quantizer 14, and the movement of charge causes a change in the voltage at the quantizer 14 input node. The more the input signal amplitude rises the less the capacitance represented by M1–M6 is charged, and the smaller is the corresponding voltage change or fluctuation at the input nodes of the quantizer 14.

Describing this first embodiment now in greater detail, the magnitude of the output voltage of the rectifier 24 is dependent on the absolute value of the input signals, shown for simplicity as the differential input signal of the SDM 10. The input signal of the SDM 10 is actually applied indirectly to the integrator 26, which may be considered to be the last integrator of the loop filter 12. The differential output of the integrator 26 drives the differential input nodes of the quantizer 14. When the difference signal is large, the output of the rectifier 24 is large, and vice versa, as shown in FIGS. 3A and 3B. The output voltage of the rectifier 24 is connected to the gate terminals of the PMOS transistors M1–M6 through switches S1–S6, the switching state of which is controlled by taps from the six DFFs of the LFSR 22. As a result, the channel charge of the PMOS transistors M1–M6 is dependent on the input signal of the SDM 10. Charge is either extracted from or injected into the input node of the quantizer 14 where it causes a voltage step, the magnitude of which is dependent on how much charge is moving back and forth between the quantizer's input node and the channels of M1–M6. Note that since the same charge is moved between the quantizer's input node and the transistor's channel, there is no current consumption except in the rectifier 24. It is shown in FIG. 3B that when the amplitude of the input signal of the SDM 10 is largest, charge movement occurs in both nodes (Vin+ and Vin–) of the quantizer's input, and the dither signal is thus the most effective. As the input signal amplitude of the SDM 10 decreases only one of the nodes of the quantizer is dithered, with corresponding decreasing charge movement. PMOS transistors M1–M6 have channel charge only when their gate-source voltage is higher than the PMOS transistors threshold voltage Vtp. The greater is the effective voltage Veff the more the PMOS transistors M1–M6 are charged, and the greater is the magnitude of the induced dither signal at the inputs to the quantizer 14.

As an example, one suitable channel width for M1–M6 could be about 2 micrometers, and a suitable channel length is about 1 micrometer. Those skilled in the art will appreciate that, when designing the channel width and length of M1–M6, among the parameters that should be considered are the supply voltages, integrated circuit technology to be used, the desired dither signal magnitude, as well as the expected magnitude of the signal swings at the outputs of the rectifier 24.

The LFSR 22 produces a pseudorandom code, and is conveniently implemented with a series of data flip flops (DFFs) and the feedback logic 23, which can be composed of XOR gates. The PMOS transistor gates M1–M6 are controlled by the LFSR 22, via switches S1–S6, and the switch control signals are taken, preferably, from arbitrary locations of the LFSR 22.

Resistors (R) are series connected between the output nodes of the integrator 26 and the input nodes of the quantizer 14 in order to generate a voltage step from the charge movement. The amplifier used to implement the integrator 24 is preferably an Operational Tranconductance Amplifier (OTA) type, and without the resistors R the amplifier would absorb the moving charge immediately, without producing the desired voltage step at the input nodes of the quantizer 14. In the preferred embodiment the RC time constant resulting from resistors R and the capacitance C of the PMOS transistors M1–M6 is small, and thus has a negligible effect on the settling characteristics of the integrator 26. The amplitude of the voltage step and its time constant can be readily changed by changing the size of the channels of the PMOS transistors M1–M6 and/or by adjusting the values of the resistors (R). The output swing and DC level of the rectifier 24 can also be varied, if desired.

The LFSR 22 pseudorandom sequence is preferably at least one second in length, and may be longer. As such, the total number of required DFFs is a function of the clock frequency. As an example, and assuming a clock frequency of 3 MHz, 22 DFFs can be used to obtain a LFSR period of 1.398 seconds.

For the case of a multi-order SDM 10, such as a fourth order SDM with a low oversampling ratio (e.g., four), there exists a possibility that the signal passing through the $4^{th}$ order loop filter 12 will experience too much delay at the inputs to the quantizer 14. There is, though, almost no delay for the input signal that controls the rectifier 24, which controls the charge of the PMOS transistors M1–M6. As such, a possibility exists that the dither signal could lead the actual input signal. This condition would have a detrimental impact on the SNR, without preventing the generation of tones by the quantizer 14.

Figure 8:
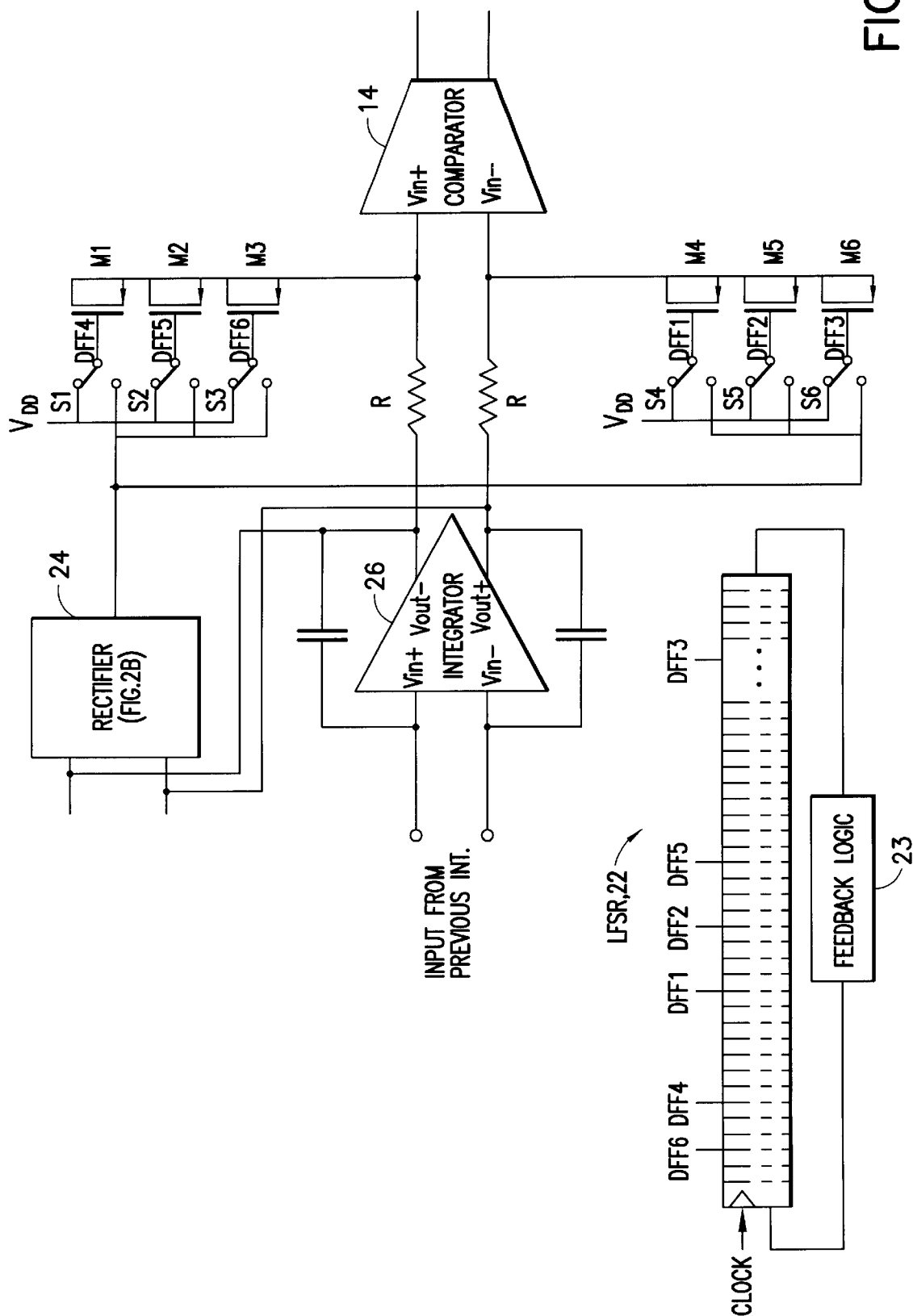
FIG. 8 shows a preferred embodiment of the coupling of the rectifier input signals to the outputs of the last integrator stage of the loop filter, just prior to the quantizer.

This problem is overcome by the embodiment shown in FIG. 8, wherein the inputs to the rectifier 24 are taken from the differential outputs of the last integrator 26 of the series of integrators implementing the higher order loop filter 12. The differential output of the last integrator 26 naturally follows the differential input signal of the SDM 10, and by taking the inputs of rectifier 24 from this point, the dither signal is timed correctly with the input of the quantizer 14 (assuming a substantially negligible delay in the rectifier 24). While the output of the last integrator 26 is essentially a quantized signal, this does not adversely affect the dependency of the dither signal magnitude on the magnitude of the input signal of the SDM 10.

Figure 4:
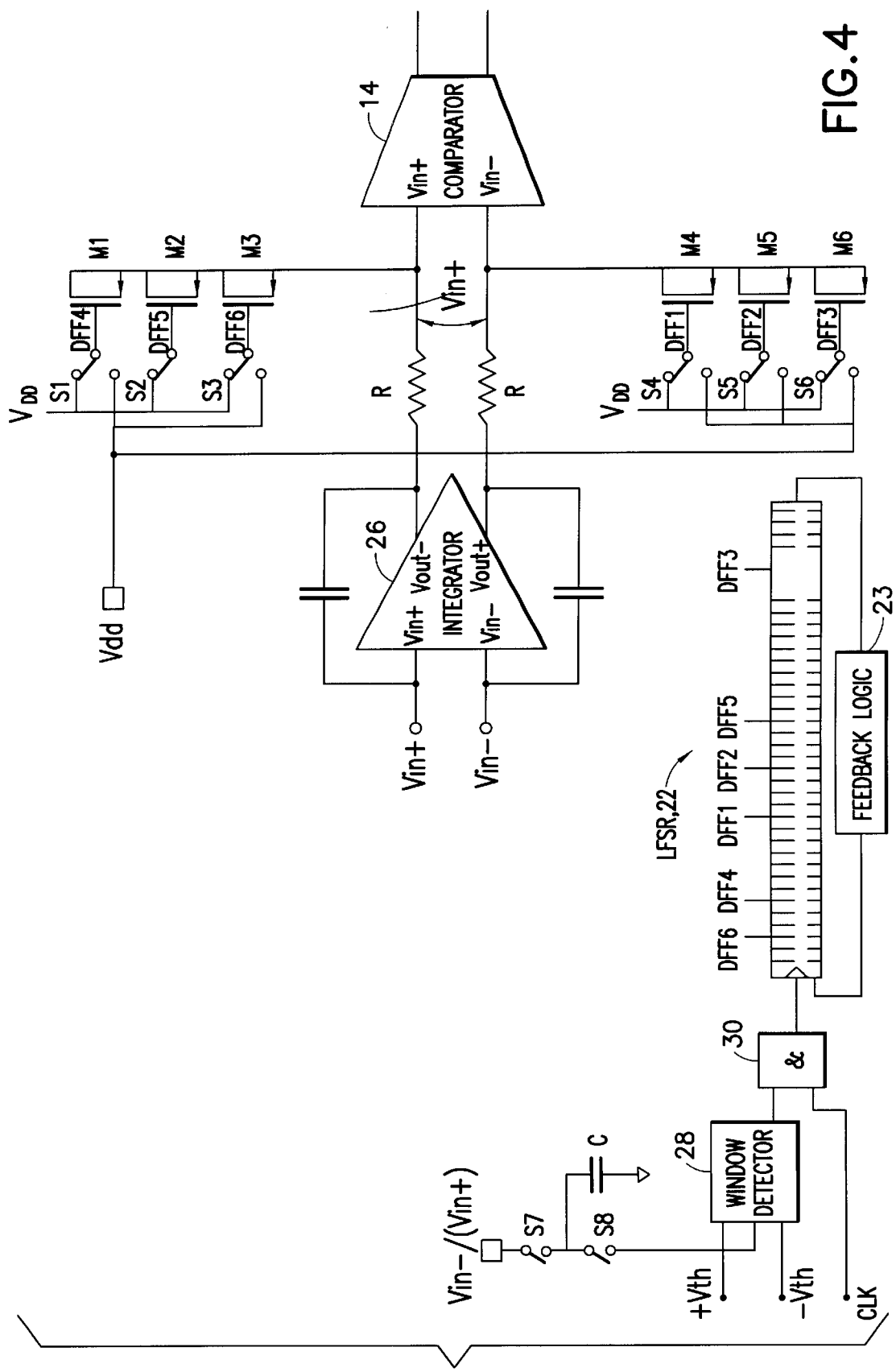
FIG. 4 is a circuit diagram of a second embodiment of the SD modulator that uses an input signal dependent pseudorandom dither signal, wherein the dither signal is selectively turned off and on as a function of the amplitude of the input signal.

Turning now to FIG. 4, a second embodiment in accordance with these teachings is shown. In this embodiment the amplitude measurement block 16 of FIG. 1 is implemented with at least one voltage window detector 28, which provides a clock control signal to the pseudorandom signal generator 18 (the charge control output of the amplitude measurement block 16 is not present).

Figure 5:
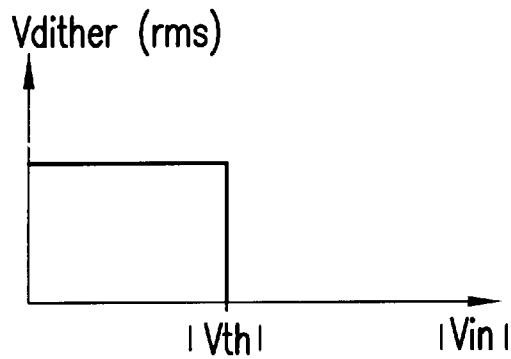
FIG. 5 is a waveform diagram that shows the dependency between the input signal and the dither magnitude for the second embodiment of FIG. 4.
Figure 9:
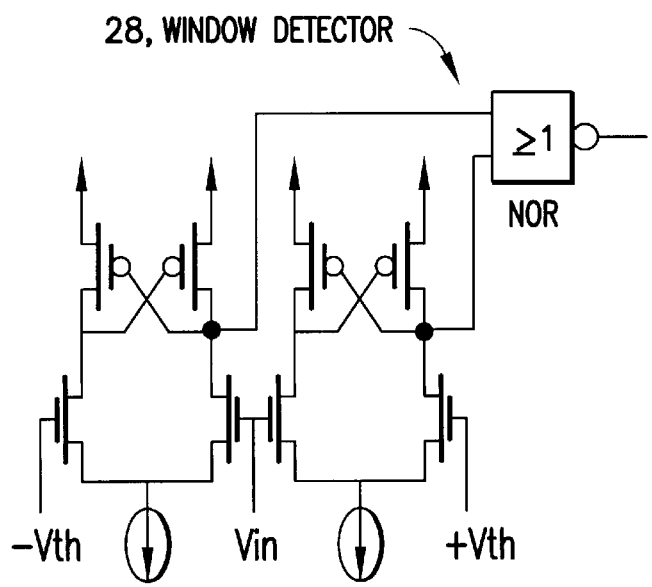
FIG. 9 illustrates one suitable construction of the window detector(s) found in the embodiments of FIGS. 4 and 6.

More particularly, the input signal of the SDM 10 is applied to at least one window detector (WD) 28. The number of WD's can be greater than one in order to increase the accuracy of the dither signal's dependency on the amplitude of the input signal, as will be described below with regard to FIG. 6. A graph showing the dependence of the dither signal versus the input signal to the SDM 10 is shown in FIG. 5 (for the case of one window detector 28), and FIG. 9 shows a suitable embodiment for the window detector 28. The window detector 28 quantizes the amplitude of the input signal that is sampled by switches S7 and S8 onto sampling capacitance C. The window detector 28 is not required to be accurate, and a small, low current structure composed of two differential transistor pairs with regenerative loads and a NOR gate can be used, as is shown in FIG. 9. The output of the window detector 28 controls, via AND gate 30, the application of the clock (CLK) signal to the LFSR 22. The voltage thresholds (±Vth) for the window detector 28 may be generated with a chain of resistors or diode-connected MOS transistors (not shown). The voltage thresholds are not required to be accurate, enabling small structures can be used. So long as the amplitude of the input signal Vin falls within the range of threshold voltages applied to the window detector 28, the window detector outputs an enabling signal to the AND gate 30, which then passes the clock to the LFSR 22. When the window detector 22 determines that dither is not needed, it stops the LFSR 22 by disabling the input clock to the LFSR 22, via AND gate 30. In this embodiment, as in the embodiment of FIG. 2, the LFSR 22 controls the transistors M1–M6, via switches S1–S6. In this embodiment, however, the gate terminals of M1–M6 are connected to either ground potential or to some other (constant) potential, such as Vdd, depending on the control signals generated by the DFF taps DFF1–DFF6 taps of the LFSR 22.

More specifically, the input signal Vin is sampled onto the small capacitor C by closing S7 (S8 is open) to avoid kickback noise from the window detector 28, and then S7 is opened and S8 is closed. The sampled input voltage appearing across C is applied through S8 to the Vin terminal of the window detector 28, which quantizes the sampled amplitude to control the clocking of the LFSR 22. If the input signal amplitude is sufficiently large, i.e., outside of the window threshold of the window detector 28, no dither is needed, and the output of the window detector stops the clock to the LFSR 22, via AND gate 30. As an example, the window detector thresholds +Vth and −Vth could be set to be about 50% less than the largest expected positive and negative input signal amplitude excursions (assuming the use of one window detector 28 as in FIG. 4). The dependency of the dither signal on the amplitude of the input signal to the SDM 10 is thus controlled with the one or more window detectors 28, and not with a variable channel charge of the PMOS transistors M1–M6, as was the case for the embodiment of FIG. 2. Instead, in this embodiment, and only when dither is required, the gate terminals of the capacitor-connected PMOS transistors M1–M6 are pseudorandomly switched between Vdd and circuit ground, depending on the control signals generated by the LFSR 22. The switching in and out of variable numbers of capacitances at the input nodes of the quantizer 14 has, however, substantially the same effect as in the embodiment of FIG. 2, as voltage transients of non-constant amplitude are generated which form the desired dither signal.

Figure 7:
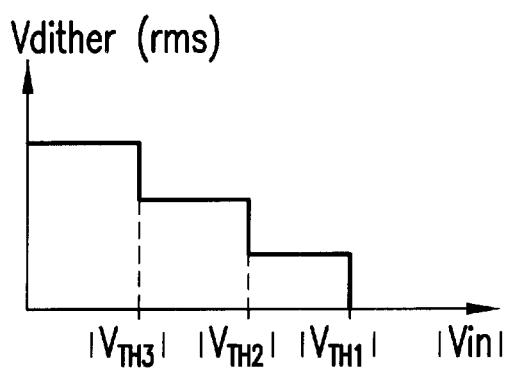
FIG. 7 is a waveform diagram that shows the dependency between the input signal and the dither magnitude for the case of multiple window detectors as in the third embodiment of FIG. 6.
Figure 6A:
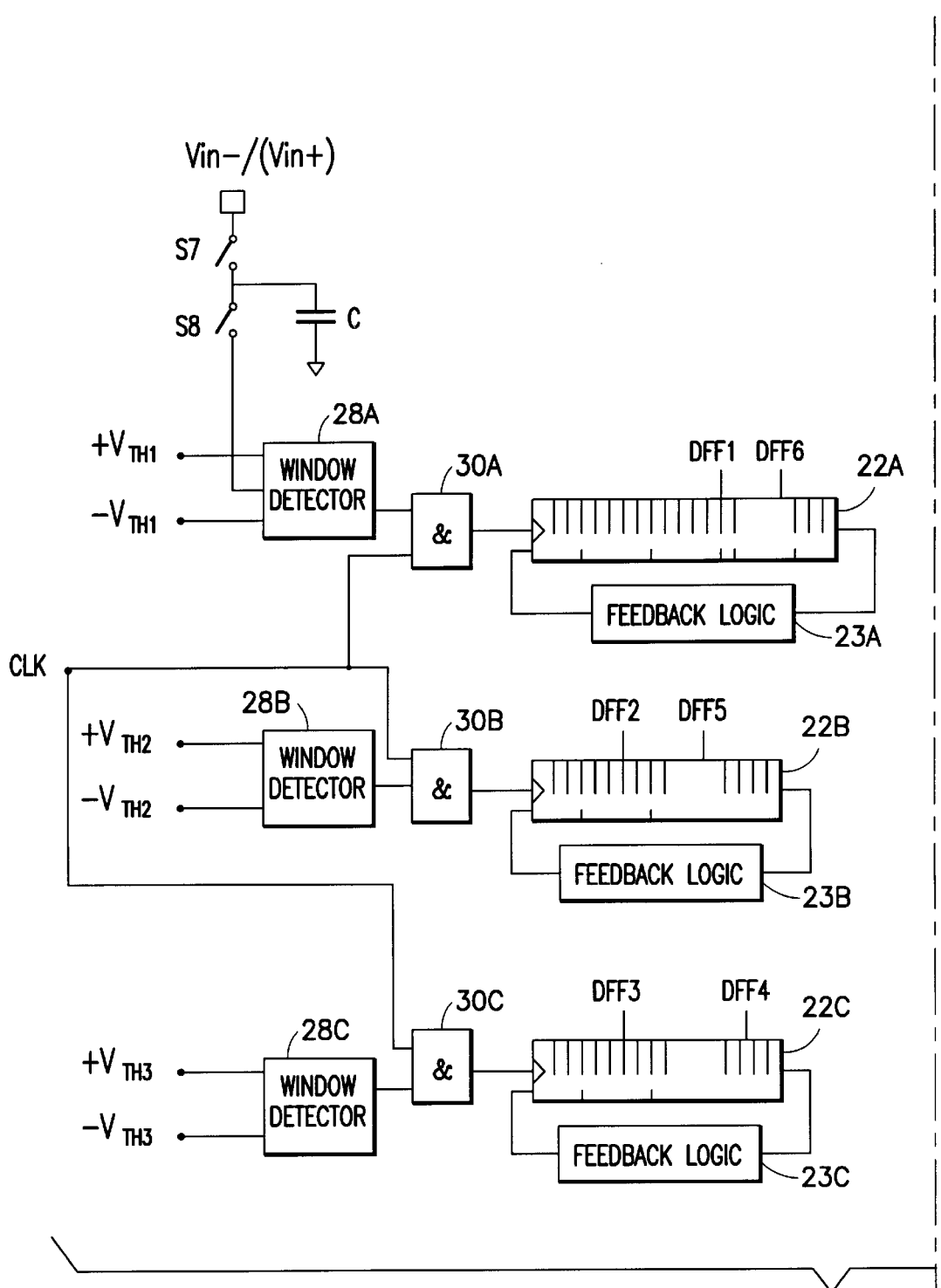
FIG. 6 is a circuit diagram of a third embodiment of the SD modulator that uses an input signal dependent pseudorandom dither signal, wherein multiple window detectors and pseudorandom signal generators are provided, and where the dither signal is selectively controlled as a function of the amplitude of the input signal.
Figure 6B:
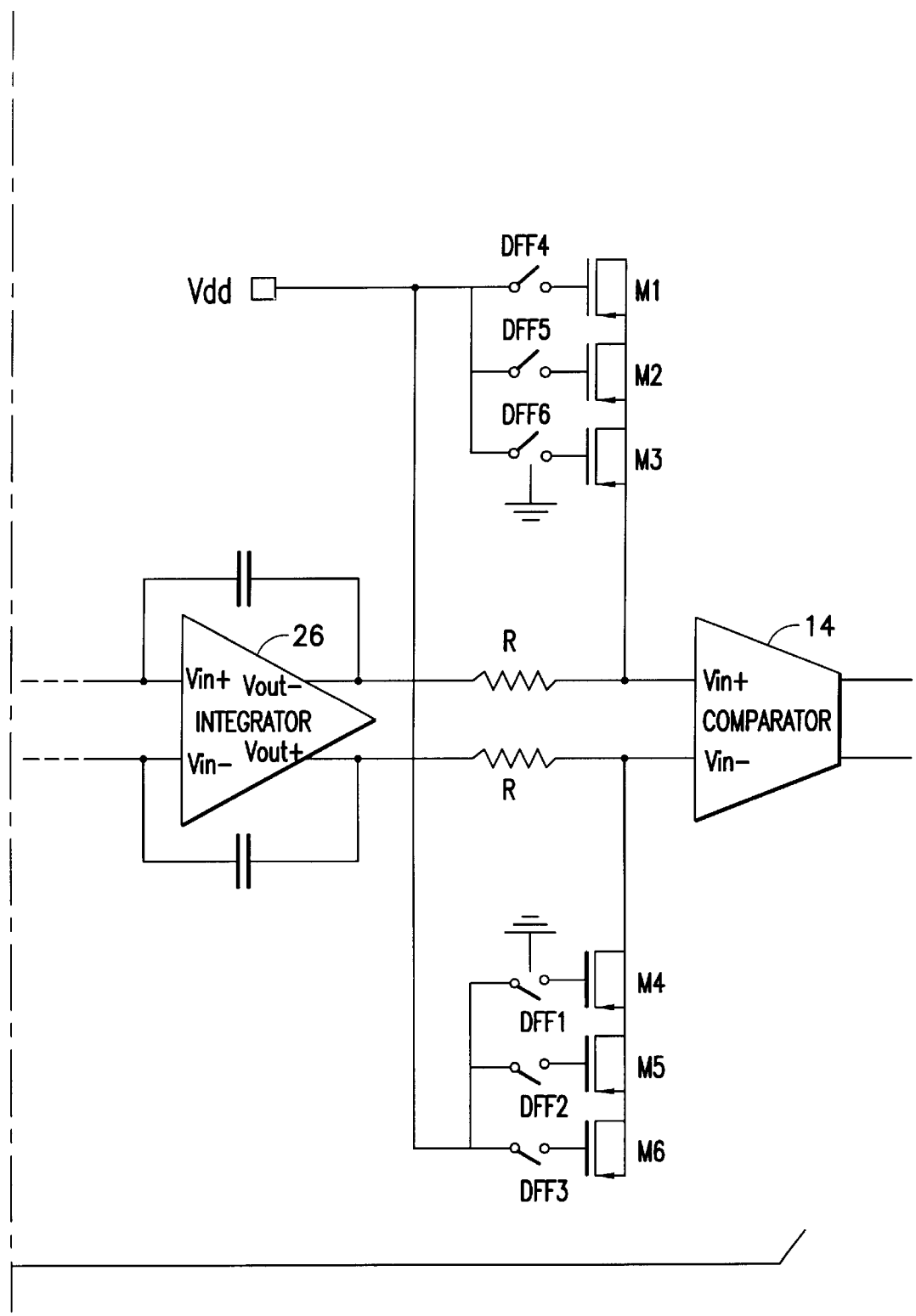

FIG. 6 illustrates an embodiment wherein finer control over the magnitude of the dither signal is achieved than the embodiment of FIG. 4. This is accomplished by providing a plurality of window detectors, such as the three designated 28A, 28B and 28C (collectively referred to as window detectors 28). Each of the window detectors 28 is associated with a corresponding LFSR 22, designated 22A, 22B and 22C (collectively referred to as LFSRs 22), and feedback logic 23A, 23B and 23C. Each of the window detectors 28 operates with a different set of threshold voltages, ±Vth1, ±Vth2 and ±Vth3, as shown as well in FIG. 7. In this embodiment the length of the LFSRs 22 is preferably different, providing different code repeat periods, and the longest length may be shorter than in the single LFSR embodiment of FIG. 4. Each of the window detectors 28 controls, via an associated AND gate 30A, 30B, 30C, the on/off state of the clock signal applied to its associated LFSR 22A, 22B, 22C, respectively.

In operation, and when the input signal to the window detectors 28 is between Vth1 and Vth2 (see FIG. 7), only the LFSR 22A is running (the clocks to LFSRs 22B and 22C are gated off). Two control signals DFF1 and DFF6 are taken from LFSR 22A, and thus apply a minimum amount of dither to each of the differential input nodes of the quantizer 14. As the magnitude of the input signal decreases towards zero, LFSR 22B and then LFSR 22C begin to run, thereby injecting more dither signal into the quantizer 14 inputs nodes.

When only LFSR 22A is running a minimum amount of dither is generated which has a minimum impact of the SNR and output spectrum of the SDM 10. As such, it can be appreciated that the length of the LFSR 22A is not critical. The remaining LFSRs 22B and 22C are preferably shorter. For example, if the clock signal is 3 MHz, and assuming that LFSR 22A has 22 DFF stages, then LFSR 22B could contain 7 DFFs, and LFSR 22C could contain 4 DFFs. When more than LFSR 22A is running, it can be appreciated that the dither signal injected into the input nodes of the quantizer 14 assumes a greater pseudorandom nature, as the controlling signals to M1–M6 are taken from different ones of the LFSRs 22, each having a different length and code repeat period. As such, a type of mixing occurs at the inputs to the quantizer 14.

The foregoing embodiments of this invention add dither to the input to the quantizer 14 where the dither signal has the same noise shaping characteristics as the quantization noise, and therefore causes the least amount of reduction in the SDM 10 dynamic range. In these embodiments the dither amplitude depends on, and is inversely proportional to, the amplitude of the input signal to the SDM 10. With a large input signal the amplitude of the dither signal is small, and thus does not overload the quantizer and reduce the dynamic range of the SDM 10. With a small input signal the dither amplitude is sufficiently large to prevent the generation of tones, and to thus improve the signal-to-noise ratio (SNR) of the SDM 10. By avoiding the use of a predetermined square wave dither signal, the out of band noise is not appreciably mixed into the signal band, and the likelihood of overloading the quantizer 14 is also reduced. Furthermore, the disclosed embodiments are relatively simple to implement, and consume little integrated circuit die area and little operating power. These embodiments can be implemented in analog or digital CMOS technologies.

It should be appreciated that both of the foregoing embodiments of these teachings operate to sample the amplitude of the input signal to the sigma-delta modulator 10, and to control the switching of the capacitance bank 20 in accordance with the sampled amplitude of the input signal for generating the dither signal at the input of the quantizer 14, where the dither signal is generated to have a pseudo-random amplitude that is inversely proportional to the sampled amplitude of the input signal.

While described in the context of specific numbers of capacitance-connected PMOS FETs and associated switches and LFSR stages, etc., it should be appreciated that these are exemplary of the presently preferred embodiments, and are not intended to be read in a limiting sense upon the practice of these teachings. Furthermore, while disclosed in at least some of the Figures in a single-ended configuration, the teachings of this invention could be implemented as well in a differential configuration.

Thus, while the invention has been particularly shown and described with respect to preferred embodiments thereof, it will be understood by those skilled in the art that changes in form and details may be made therein without departing from the scope and spirit of the invention.

What is claimed is:

1. A method to operate a sigma-delta modulator of a type that includes a quantizer, comprising steps of:
   sampling an amplitude of an input signal to the sigma-delta modulator; and
   controlling the switching of a switched capacitance bank in accordance with the sampled amplitude of the input signal for generating a dither signal at an input of the quantizer, said dither signal being generated to have a pseudorandom amplitude that is inversely proportional to the sampled amplitude of the input signal, where said switched capacitance bank is coupled to said input of said quantizer for injecting charge into said input and for extracting charge from said input in accordance with the sampled amplitude of the input signal, said injected and extracted charge causing a voltage step at said input to said quantizer for generating said dither signal.

2. A method as in claim 1, wherein the step of controlling and generating operates a linear feedback shift register to switch individual ones of a plurality of capacitances of said bank of capacitances in and out of a capacitance network.

3. A method as in claim 2, wherein the step of operating the at least one linear feedback shift register turns a linear feedback shift register clock signal on and off as a function of the amplitude of the input signal.

4. A method as in claim 1, wherein the step of sampling samples the input signal to prevent a generation of kickback noise into the input signal.

5. A method as in claim 1, wherein the step of sampling operates at least one window detector, and wherein the dither signal is turned off and on depending on a relationship between the amplitude of the input signal and voltage thresholds of the window detector.

6. A method as in claim 1, wherein the step of sampling operates a rectifier that rectifies a signal applied to inputs of the quantizer to provide a rectified output signal, and wherein the step of controlling and generating pseudorandomly applies the rectified output signal to the bank of capacitances for controlling an amount of current that is transferred between the input of the quantizer and the bank of capacitances.

7. A sigma-delta modulator of a type that includes a quantizer, comprising:
   circuitry for sampling an amplitude of a signal that is to be applied to an input of the quantizer; and
   a bank of switched capacitances for generating a dither signal at input nodes of said quantizer, said dither signal being generated to have a pseudorandom amplitude that is inversely proportional to the sampled amplitude of the signal, where each of said input nodes of said quantizer is coupled to an associated plurality of parallel connected capacitances for injecting charge into said input nodes and for extracting charge from said input nodes in accordance with the sampled amplitude of the input signal, said injected and extracted charge causing a voltage step at said input nodes of said quantizer for generating said dither signal.

8. A sigma-delta modulator as in claim 7, and further comprising a linear feedback shift register having outputs coupled to said bank of switched capacitances for switching individual ones of a plurality of capacitances of said bank of capacitances in and out of a capacitance network.

9. A sigma-delta modulator as in claim 8, wherein said sampling circuitry turns a linear feedback shift register clock signal on and off as a function of the amplitude of the input signal.

10. A sigma-delta modulator as in claim 7, wherein said sampling circuitry samples the signal to prevent a generation of kickback noise.

11. A sigma-delta modulator as in claim 7, wherein said sampling circuitry comprises at least one window detector, and wherein the dither signal is turned off and on depending on a relationship between the amplitude of the signal and voltage thresholds of the window detector.

12. A sigma-delta modulator as in claim 7, wherein said sampling circuitry comprises a rectifier that rectifies the signal to provide a rectified output signal, and further comprising circuitry for pseudorandomly applying the rectified output signal to the bank of capacitances for controlling an amount of current that is transferred between the input of the quantizer and the bank of capacitances.

13. A sigma-delta modulator of a type that includes a quantizer, comprising:
   a rectifier that rectifies an input signal to the quantizer to provide a rectified output signal having an amplitude that is inversely proportion to the amplitude of the input signal of the sigma-delta modulator;
   a first bank of voltage-variable capacitances coupled in parallel to a first input node of said quantizer and a second bank of voltage-variable capacitances coupled in parallel to a second input node of said quantizer; and
   a plurality of switches operated pseudorandomly for selectively applying either the rectified output signal or another signal to control terminals of said voltage-variable capacitances, where the magnitude of the rectified output signal controls a value of the total capacitance presented to the input nodes of the quantizer for generating a dither signal having a pseudorandom amplitude that is inversely proportional to the amplitude of the input signal of the sigma-delta modulator.

14. A sigma-delta modulator as in claim 13, wherein said first and second banks of capacitances are comprised of FETs, and where said plurality of switches selectively apply the rectified output signal or the another signal to gate terminals of individual ones of said FETs.

15. A sigma-delta modulator as in claim 13, wherein said rectifier rectifies a differential signal that is output from an integrator, said output signal of said integrator also being input to said quantizer.

16. A sigma-delta modulator as in claim 13, and further comprising at least one linear feedback shift register having outputs coupled to said plurality of switches for controlling the switching thereof.

17. A sigma-delta modulator of a type that includes a quantizer, comprising:
   at least one window detector that compares an input signal to the sigma-delta modulator to a pair of threshold potentials to generate a window detection signal;
   a first bank of voltage-variable capacitances coupled in parallel to a first input node of said quantizer and a second bank of voltage-variable capacitances coupled in parallel to a second input node of said quantizer;
   a pseudorandom signal generator having an input clock signal that is selectively gated on or off by said window detection signal; and
   a plurality of switches coupled to said pseudorandom signal generator and operated pseudorandomly thereby for selectively applying either a first voltage potential or a second voltage potential to control terminals of said voltage-variable capacitances to control a value of the total capacitance presented to the input nodes of the quantizer for generating a dither signal having a pseudorandom amplitude that is inversely proportional to the amplitude of the input signal.

18. A sigma-delta modulator as in claim 17, wherein said first and second banks of capacitances are comprised of FETs, and where said plurality of switches selectively apply the first voltage potential or the second voltage potential to gate terminals of individual ones of said FETs.

* * * * *